United States Patent
Lee

(10) Patent No.: US 7,524,720 B2
(45) Date of Patent: Apr. 28, 2009

(54) METHOD OF MANUFACTURING SEMICONDUCTOR DEVICE

(75) Inventor: Young Seong Lee, Anyang-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 297 days.

(21) Appl. No.: 11/616,055

(22) Filed: Dec. 26, 2006

(65) Prior Publication Data

US 2007/0148852 A1   Jun. 28, 2007

(30) Foreign Application Priority Data

Dec. 28, 2005   (KR)   ............... 10-2005-0132676

(51) Int. Cl.
*H01L 21/8238* (2006.01)
(52) U.S. Cl. ............... 438/216; 438/275; 438/591; 438/981; 257/E21.625
(58) Field of Classification Search ............... 438/216
See application file for complete search history.

(56) References Cited

U.S. PATENT DOCUMENTS

| 6,165,918 | A | * | 12/2000 | Jia et al. | .................. 438/227 |
| 6,436,771 | B1 | * | 8/2002 | Jang et al. | .................. 438/275 |
| 7,091,074 | B2 | * | 8/2006 | Han et al. | .................. 438/197 |
| 2005/0205939 | A1 | * | 9/2005 | Lee et al. | .................. 257/371 |
| 2005/0280099 | A1 | * | 12/2005 | Park et al. | .................. 257/374 |
| 2006/0275977 | A1 | * | 12/2006 | Bojarczuk et al. | .................. 438/216 |
| 2007/0173009 | A1 | * | 7/2007 | Mochizuki | .................. 438/223 |

\* cited by examiner

*Primary Examiner*—Stephen W Smoot
(74) *Attorney, Agent, or Firm*—Saliwanchik, Lloyd & Saliwanchik

(57) ABSTRACT

A method of manufacturing a semiconductor device is provided. The method includes the steps of forming a gate oxide layer including an oxide layer containing a large amount of nitrogen on a semiconductor substrate on which an input/output (I/O) region including an NMOS region and a PMOS region are defined, forming a polysilicon on the gate oxide layer, selectively removing the polysilicon on the PMOS region, selectively removing the gate oxide layer on the PMOS region, forming a pure $SiO_2$ layer on the semiconductor substrate of the PMOS region, removing a surface oxide layer on the remaining polysilicon generated when the pure $SiO_2$ layer is formed, and forming a gate electrode polysilicon on the entire surface including the remaining polysilicon.

8 Claims, 4 Drawing Sheets

METHOD OF MANUFACTURING SEMICONDUCTOR DEVICE

RELATED APPLICATION(S)

This application claims priority under 35 U.S.C. §119(e) of Korean Patent Application No. 10-2005-0132676 filed Dec. 28, 2005, which is incorporated herein by reference in its entirety.

FIELD OF THE INVENTION

The present invention relates to a method of manufacturing a semiconductor device.

BACKGROUND OF THE INVENTION

It is necessary to reduce the line width in order to manufacture a highly integrated semiconductor device. However, the operation voltage of the semiconductor device is fixed by a specification standard.

Therefore, it can be difficult to design processes for maintaining the reliability of the device. Specifically, hot carrier and negative bias temperature instability (NBTI) have a strong impact on semiconductor manufacturing, and it can be difficult to provide manufacturing conditions addressing these issues. In particular, because hot carrier injection (HCI) characteristic and negative bias temperature instability (NBTI) characteristic have conflicting trends in accordance with the influence of nitrogen under a condition where a NO gate insulating layer of a single structure is applied, the limits of improved reliability and yield are expected to be reached.

Recently, the thickness of the gate oxide layer of a semiconductor device composed of a core region and an input/output (I/O) region has doubled in response to the operation voltage.

FIGS. 1A to 1D illustrate a conventional method of forming a gate insulating layer of a semiconductor device.

As illustrated in FIG. 1A, a first gate oxide layer 12 is grown on the entire surface of a semiconductor substrate 11 where a field oxide layer (FOX) is formed.

As illustrated in FIG. 1B, an I/O region is covered with a photoresist (PR) layer 13 to remove the first gate oxide layer 12 from a core region by performing a wet etching process.

As illustrated in FIG. 1C, after removing the PR layer 13, a second gate oxidation process is performed to grow a thin second gate oxide layer 14 on the semiconductor substrate 11 of the core region. At this time, the I/O region is additionally oxidized under the first gate oxide layer 12 to form the second gate oxide layer 14 such that the I/O region includes the first gate oxide layer 12 and the second gate oxide layer 14 to form a thick gate oxide layer.

As illustrated in FIG. 1D, nitrogen annealing is performed to form an N-rich oxide layer 15 containing a large amount of nitrogen on the interface between each gate oxide layer and the semiconductor substrate 11. The gate oxide layer structure in which the N-rich oxide layer 15 is formed is referred to as an NO gate oxide layer.

The NO gate oxide layer has strong tolerance against the hot carrier issues of the I/O NMOS. Specifically, during the operation of a transistor, an electro-hole pair (EHP) is generated in the leading end of a drain adjacent to the gate oxide layer by a strong electric field between source/drain and electron injection to the gate insulating layer is generated by the electric field of the gate electrode.

At this time, since the Si—N combination formed on the interface of the NO gate oxide layer has high stability with respect to electron injection in comparison with the Si—O combination, it is possible to improve a hot carrier characteristic.

On the other hand, the NO gate oxide layer applied to I/O PMOS is vulnerable to the NBTI, which is because surplus nitrogen contained in the insulating layer operates as the site of hole generation during the operation of a transistor.

Therefore, due to the increase in a threshold voltage and the reduction in driving current, the life of a product is reduced. Therefore, in order to simultaneously correspond to the HCI characteristic and the NBTI characteristic, the I/O NMOS is preferably formed of the NO gate oxide layer and the I/O PMOS is preferably formed of a pure $SiO_2$ layer.

BRIEF SUMMARY

The preferred embodiment of the present invention has been made to address the above problem occurring in the prior art, and therefore, it is an object of the present invention to provide a method of manufacturing a semiconductor device capable of improving the HCI tolerance of I/O NMOS and the NBTI of PMOS.

In order to achieve the above object, a method of manufacturing a semiconductor device according to an embodiment of the present invention includes the steps of forming a gate oxide layer including an oxide layer containing a large amount of nitrogen on a semiconductor substrate on which an input/output (I/O) region including an NMOS region and a PMOS region are defined, forming a polysilicon on the gate oxide layer, selectively removing the polysilicon on the PMOS region, selectively removing the gate oxide layer on the PMOS region, forming a pure $SiO_2$ layer on the semiconductor substrate of the PMOS region, removing a surface oxide layer on the polysilicon generated when the pure $SiO_2$ layer is formed, and forming a gate electrode polysilicon on the entire surface including the remaining polysilicon.

DETAILED DESCRIPTION OF THE INVENTION

Hereinafter, embodiments of the present invention will be described in detail with reference to the attached drawings.

FIGS. 2A to 2G illustrate a method of manufacturing a semiconductor device according to an embodiment of the present invention.

Figure 1A:
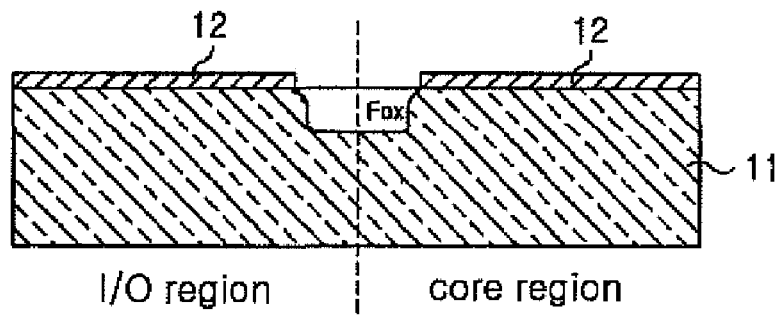
FIGS. 1A to 1D illustrate a conventional method of forming a gate insulating layer of a semiconductor device.
Figure 1B:
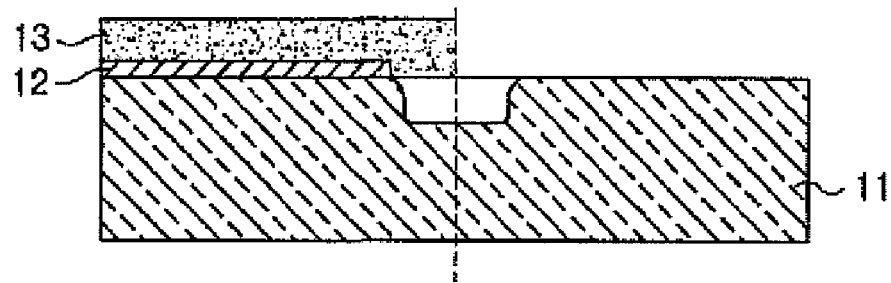
Figure 1C:
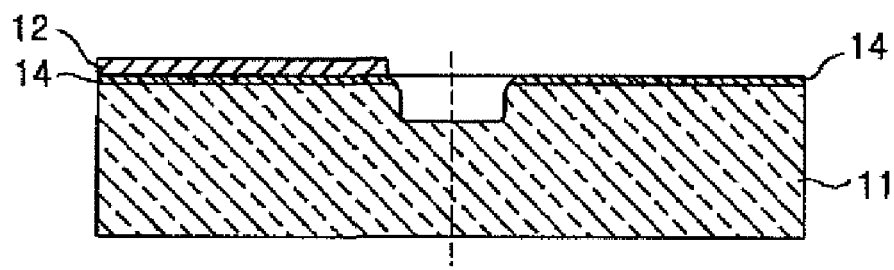
Figure 1D:
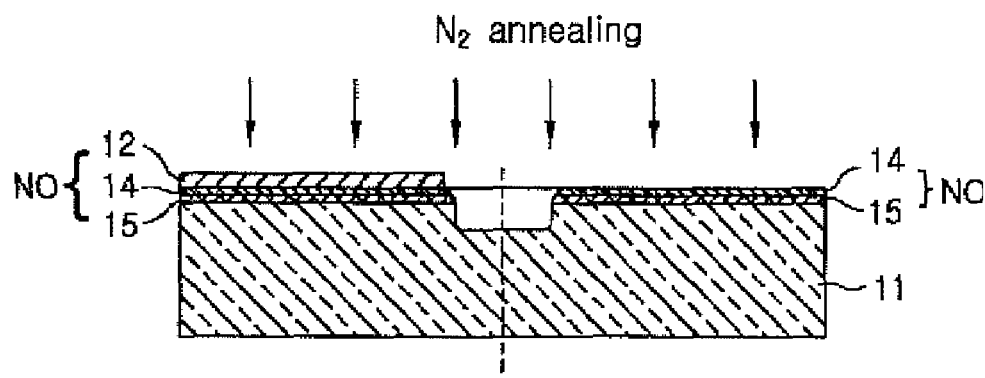
Figure 2A:
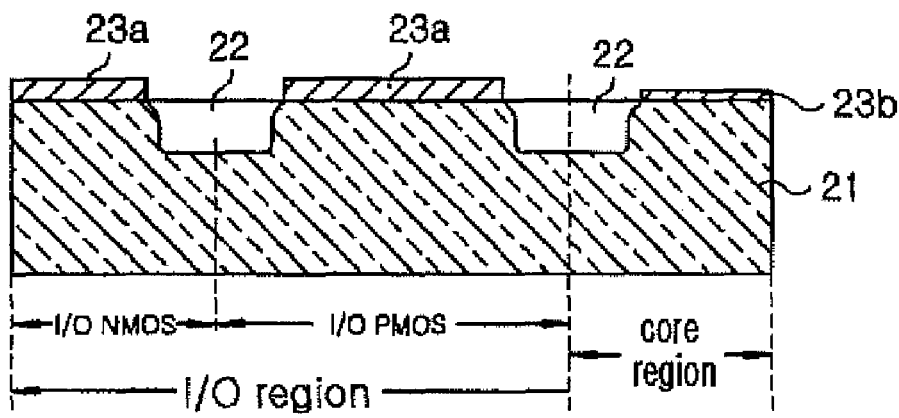
FIGS. 2A to 2G illustrate a method of manufacturing a semiconductor device according to an embodiment of the present invention.

Referring to FIG. 2A, after an ion implantation is performed to form a well (not shown) on a semiconductor substrate 21 having a field oxide layer 22 formed therein by an STI process, NO gate oxide layers 23a and 23b are formed on the active region of the semiconductor substrate 21.

At this time, a method of forming the NO gate oxide layers 23a and 23b can be the same as the conventional art. For example, after growing a first gate oxide layer through a first gate oxide process, an I/O region can be covered to remove the first gate oxide layer of the core region by a wet etching process.

Then, a second gate oxidation process is performed to grow a thin second gate oxide layer in the core region. At this time, the I/O region is additionally oxidized by the second gate oxidation process under the first gate oxide layer to form a thick gate oxide layer.

Then, nitrogen annealing is performed to form an N-rich oxide layer containing a large amount of nitrogen on the interface between each gate oxide layer and the semiconductor substrate 21.

The gate oxide layer structure in which the N-rich oxide layer is formed is referred to as an NO gate oxide layer. That is, the N-rich oxide layer and the first gate oxide layer and the N-rich oxide layer and the second gate oxide layer are referred to as the NO gate oxide layer.

The thickness of the NO gate oxide layer in the I/O region is different from the thickness of the NO gate oxide layer in the core region. That is, the semiconductor substrate 21 is divided into the I/O region and the core region in accordance with the purpose of use and the I/O region is further divided into an NMOS region and a PMOS region. The thickness of the NO gate oxide layer 23a formed in the I/O region is larger than the thickness of the NO gate oxide layer 23b formed in the core region.

Figure 2B:
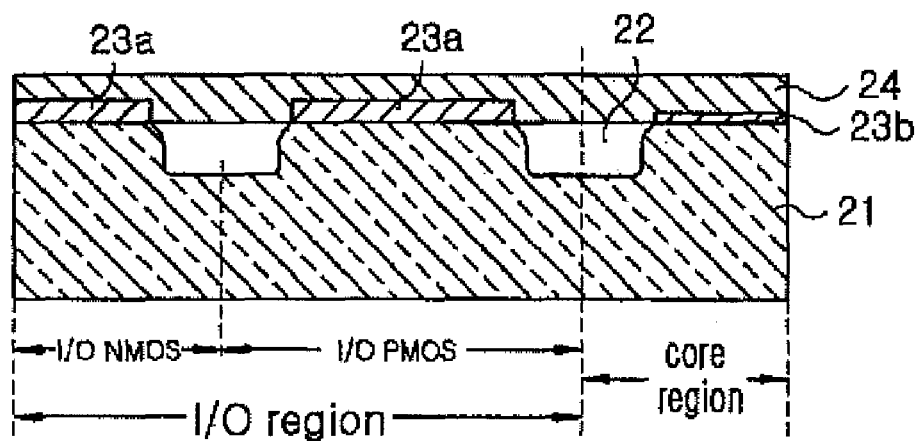

Referring to FIG. 2B after the NO gate oxide layers 23a and 23b are formed, polysilicon 24 can be deposited on the entire surface. At this time, the thickness of the polysilicon 24 can vary in accordance with the thickness of the NO gate oxide layers 23a and 23b, and can be formed to a thickness of 200 to 300 Å.

The polysilicon 24 will function to cover a remaining region when a pure $SiO_2$ layer is grown in the I/O PMOS region.

Figure 2C:
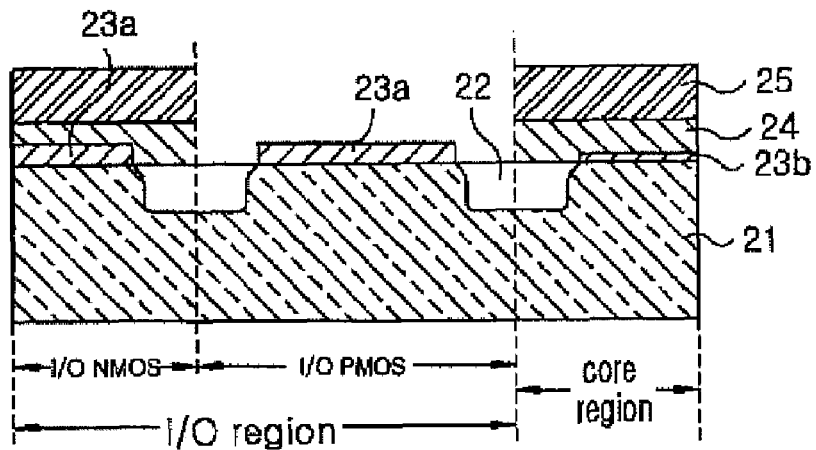

Referring to FIG. 2C, a PR layer 25 can be formed on the Substrate 21 to expose the I/O PMOS region while covering the remaining regions. Then, the polysilicon 24 in the I/O PMOS region can be removed using a dry etching method using the PR layer 25 as an etching mask.

Figure 2D:
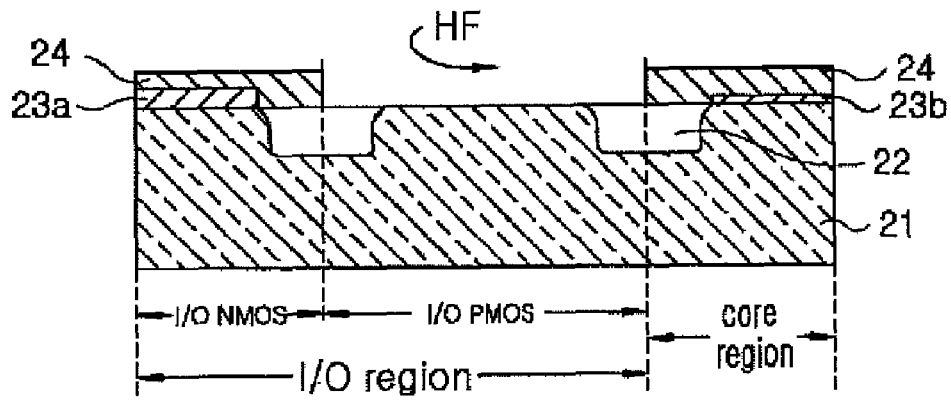

Referring to FIG. 2D, after removing the PR layer 25, the NO gate oxide layer 23a in the I/O PMOS region can be removed by HF solution. At this time, when the HF solution is applied, the polysilicon 24 functions as an etching barrier for the covered remaining regions.

Figure 2E:
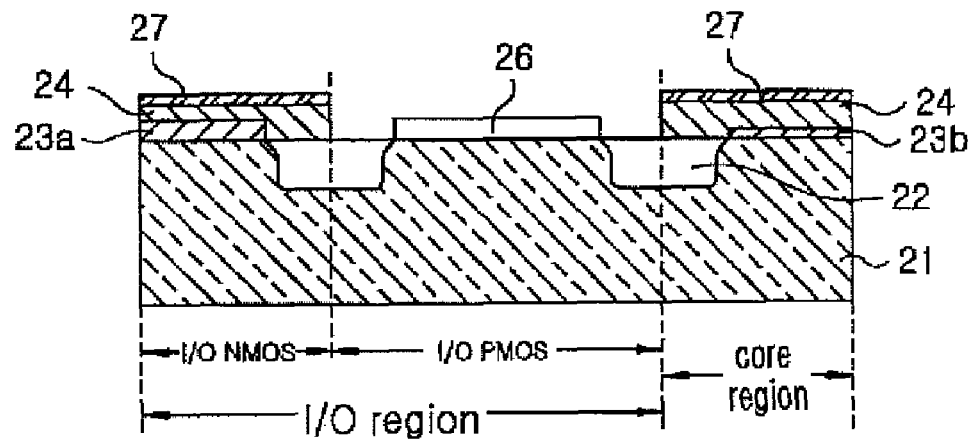

Referring to FIG. 2E, an oxidation process can be performed in a furnace to grow a pure $SiO_2$ 26 on the exposed semiconductor substrate 21 in the I/O PMOS region. At this time, in the remaining regions covered with the polysilicon 24, the surface of the polysilicon 24 is oxidized to form a surface oxide layer 27. In the I/O PMOS region, the pure $SiO_2$ layer 26 is grown to a predetermined thickness.

Figure 2F:
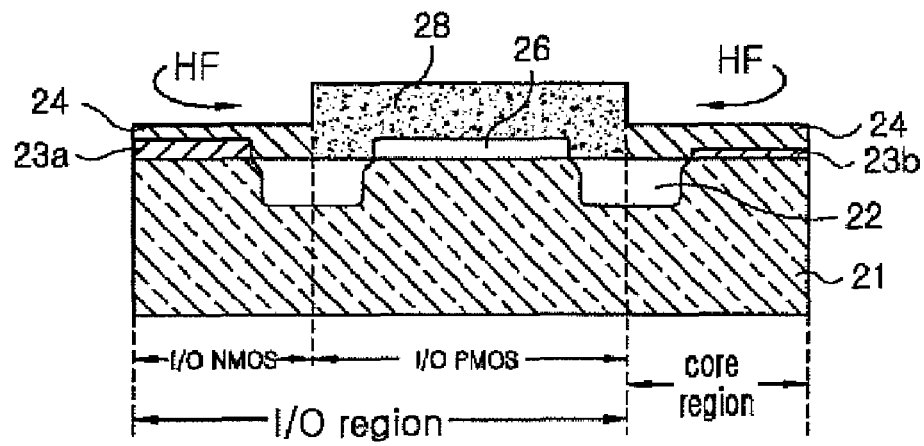

Referring to FIG. 2F, after the growth of the pure $SiO_2$ is completed, the I/O PMOS region can be covered with a PR layer 28.

Then, the surface oxide layer 27 on the surface of the polysilicon 24 on the remaining regions can be removed by the HF solution. In a specific embodiment, the thickness of the remaining polysilicon 24 must be controlled within 50 Å. As described above, the thickness of the gate oxide layer used for the I/O region is set and the thickness of initially deposited polysilicon is set in consideration of the thickness of the gate oxide layer.

Figure 2G:
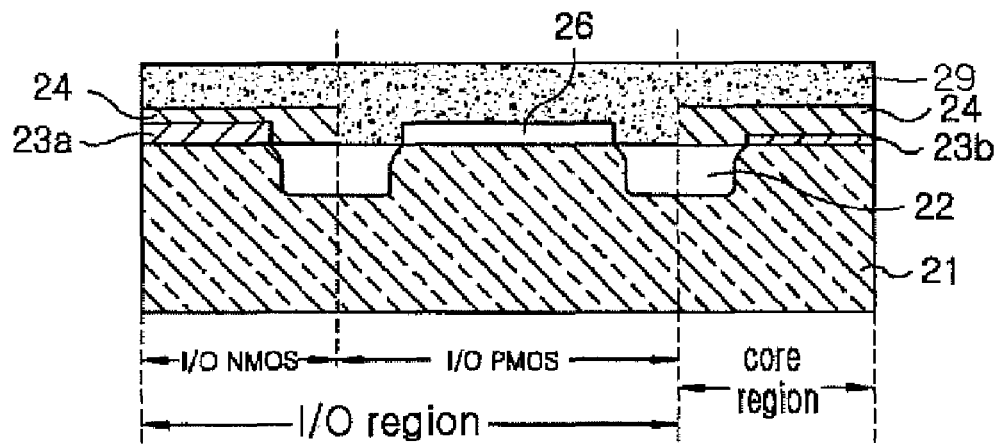

Then, referring to FIG. 2G, after removing the PR layer, a gate electrode polysilicon 29 can be deposited. In a specific embodiment, the thickness of the gate electrode polysilicon of the I/O PMOS is controlled to be lower by 50 Å than the polysilicon used as the gate electrode of the remaining region, which may be negligible in consideration of the thickness of a gate electrode of no less than 1,000 Å.

As described above, according to embodiments of the present invention, it is possible to improve the tolerance against the HCI of the I/O NMOS and to improve the NBTI of the PMOS.

While the invention has been shown and described with reference to certain preferred embodiments thereof, it will be understood by those skilled in the art that various changes in form and details may be made therein without departing from the spirit and scope of the invention as defined by the appended claims.

I claim:

1. A method of manufacturing a semiconductor device, comprising:

forming a gate oxide layer comprising an oxide layer containing a large amount of nitrogen on a semiconductor substrate, on which an input/output (I/O) region including an NMOS region and a PMOS region are defined;

forming a polysilicon layer on the gate oxide layer;

selectively removing the polysilicon layer on the PMOS region;

selectively removing the gate oxide layer on the PMOS region;

forming a pure $SiO_2$ layer on the semiconductor substrate of the PMOS region;

removing a surface oxide layer on the polysilicon layer remaining after selectively removing the polysilicon generated by forming the pure $SiO_2$ layer; and forming a gate electrode polysilicon on the substrate including the remaining polysilicon layer and the pure $SiO_2$ layer.

2. The method of claim 1, wherein the polysilicon layer is formed to a thickness of 200 to 300 Å.

3. The method of claim 1, wherein selectively removing the polysilicon layer on the PMOS region comprises:

forming a photoresist (PR) layer on the semiconductor substrate to expose the polysilicon layer on the PMOS region and cover a remaining region;

etching the exposed polysilicon layer of the PMOS region by performing a dry etching process using the PR layer as an etching mask to remove the polysilicon layer of the PMOS region; and removing the PR layer.

4. The method of claim 1, wherein selectively removing the gate oxide layer on the PMOS region is performed using HF solution.

5. The method of claim 1, wherein forming the pure $SiO_2$ layer comprises performing an oxidation process in a furnace.

6. The method of claim 1, wherein removing the surface oxide layer on the polysilicon layer is performed using the HF solution.

7. The method of claim 1, wherein the semiconductor substrate further comprises a core region, and wherein forming a gate oxide layer comprising an oxide layer containing a large amount of nitrogen on a semiconductor substrate comprises:

forming a portion of the gate oxide layer on the core region wherein the portion of the gate oxide layer on the core region is formed thinner than the gate oxide layer formed on the I/O region.

8. The method of claim 7, wherein forming a gate oxide layer comprising an oxide layer containing a large amount of nitrogen comprises:

growing a first gate oxide layer by a first gate oxidation process;

covering the I/O region and removing the first gate oxide layer of the core region by a wet etching;

performing a second gate oxide process to increase the thickness of the first gate oxide layer of the I/O region and to grow a thin second gate oxide layer on the core region; and performing a nitrogen annealing process to form an N-rich oxide layer containing a large amount of nitrogen on interfaces between the first and second gate oxide layers and the semiconductor substrate.

* * * * *